(12) United States Patent
Kurokawa

(10) Patent No.: US 8,847,245 B2
(45) Date of Patent: Sep. 30, 2014

(54) IMAGING DEVICE INCLUDING LIGHT-EMITTING ELEMENT AND LIGHT RECEIVING ELEMENT

(71) Applicant: Semiconductor Energy Laboratory Co., Ltd., Atsugi (JP)

(72) Inventor: Yoshiyuki Kurokawa, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 13/645,546

(22) Filed: Oct. 5, 2012

(65) Prior Publication Data

US 2013/0105823 A1    May 2, 2013

(30) Foreign Application Priority Data

Oct. 28, 2011    (JP) .................. 2011-236615

(51) Int. Cl.
*H01L 31/12*    (2006.01)
(52) U.S. Cl.
USPC ...................... 257/84; 257/E31.11
(58) Field of Classification Search
CPC ............ H01L 27/14609; H01L 27/1214; H01L 27/307; H01L 27/305
USPC ................. 257/82, 84, E33.06, E31.11
See application file for complete search history.

(56) References Cited

U.S. PATENT DOCUMENTS

| 4,486,655 | A | 12/1984 | Kataoka |
| 5,751,444 | A | 5/1998 | Ward |
| 6,747,638 | B2 | 6/2004 | Yamazaki et al. |
| 7,161,185 | B2 | 1/2007 | Yamazaki et al. |
| 7,333,077 | B2 | 2/2008 | Koyama et al. |
| 7,525,523 | B2 | 4/2009 | Yamazaki et al. |
| 7,592,984 | B2 | 9/2009 | Koyama et al. |
| 7,737,478 | B2 | 6/2010 | Yanagisawa et al. |
| 8,124,924 | B2 | 2/2012 | Yanagisawa et al. |
| 2007/0108454 | A1 | 5/2007 | Yamazaki et al. |
| 2008/0237669 | A1 | 10/2008 | Yanagisawa et al. |
| 2009/0295769 | A1* | 12/2009 | Yamazaki et al. ............. 345/207 |
| 2010/0164906 | A1* | 7/2010 | Fukunaga et al. ............. 345/175 |
| 2010/0237229 | A1 | 9/2010 | Yanagisawa et al. |

(Continued)

FOREIGN PATENT DOCUMENTS

| JP | 57-166768 | 10/1982 |
| JP | 60-169270 | 9/1985 |

(Continued)

OTHER PUBLICATIONS

International Search Report (Application No. PCT/JP2012/076562; PCT15991) Dated Nov. 6, 2012.

(Continued)

*Primary Examiner* — Duy T Nguyen
(74) *Attorney, Agent, or Firm* — Nixon Peabody LLP; Jeffrey L. Costellia

(57) ABSTRACT

Objects are to provide a small imaging device that can take an image of a thick book without distortion of an image of a gutter and to improve the portability of an imaging device by downsizing the imaging device. The imaging device has imaging planes on both surfaces. All elements included in the imaging device are preferably provided over one substrate. In other words, the imaging device has a first imaging plane and a second imaging plane facing opposite to the first imaging plane.

18 Claims, 13 Drawing Sheets

(56) References Cited

U.S. PATENT DOCUMENTS

| | | |
|---|---|---|
| 2010/0277443 A1 | 11/2010 | Yamazaki et al. |
| 2011/0001725 A1 | 1/2011 | Kurokawa |
| 2011/0042766 A1 | 2/2011 | Kurokawa et al. |
| 2011/0220889 A1* | 9/2011 | Kurokawa et al. ............... 257/43 |
| 2011/0260176 A1* | 10/2011 | Onoe et al. ...................... 257/79 |
| 2012/0145887 A1 | 6/2012 | Yanagisawa et al. |

FOREIGN PATENT DOCUMENTS

| | | |
|---|---|---|
| JP | 05-068130 | 3/1993 |
| JP | 2001-147495 | 5/2001 |
| JP | 2005-327943 | 11/2005 |
| JP | 2008-182316 | 8/2008 |
| JP | 2008-182317 | 8/2008 |
| JP | 2008-270765 | 11/2008 |
| WO | WO-2008/123119 A1 | 10/2008 |
| WO | WO2009139029 * | 11/2009 |

OTHER PUBLICATIONS

Written Opinion (Application No. PCT/JP2012/076562;PCT15991) Dated Nov. 6, 2012.

* cited by examiner

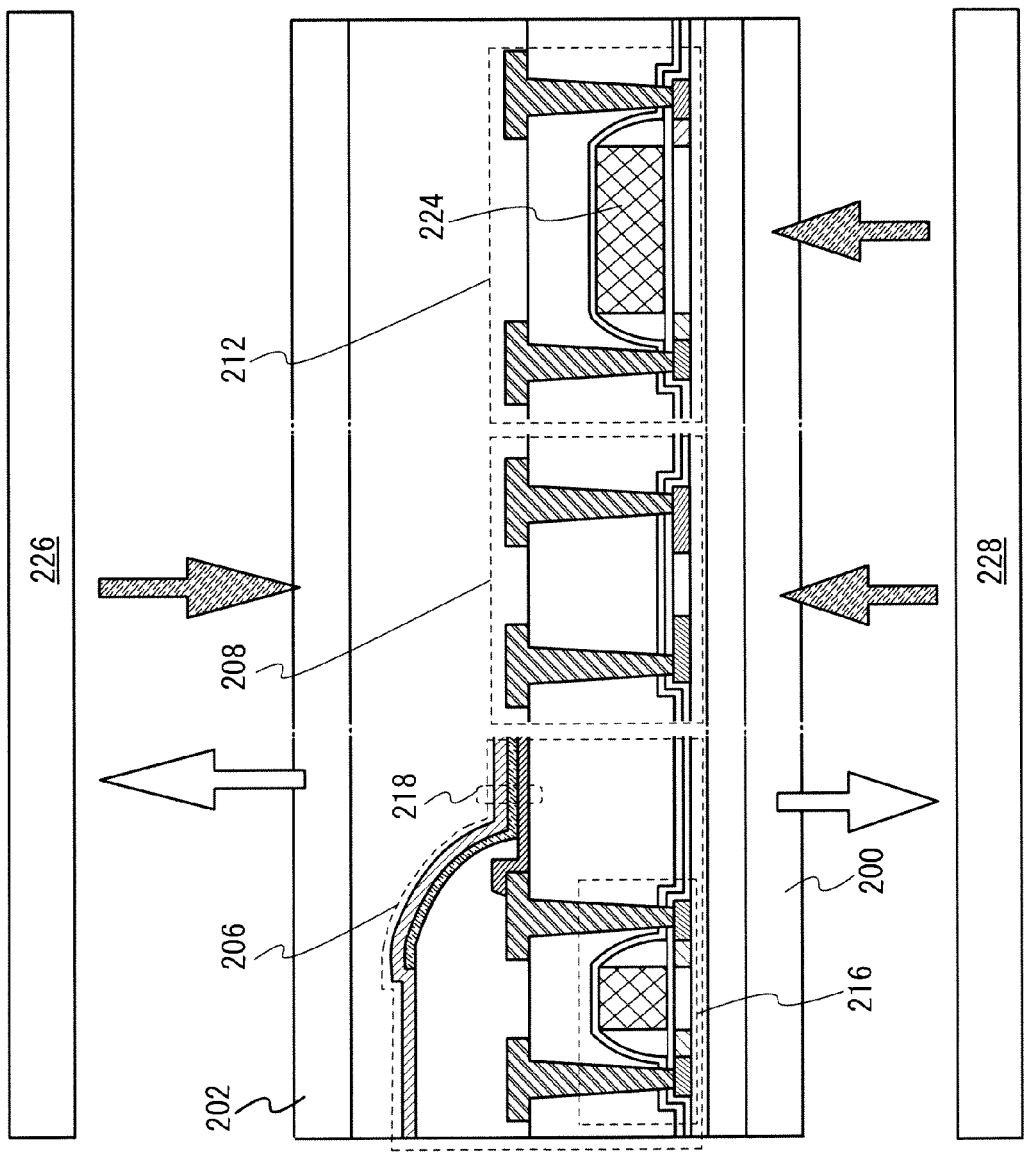

IMAGING DEVICE INCLUDING LIGHT-EMITTING ELEMENT AND LIGHT RECEIVING ELEMENT

CROSS-REFERENCE TO RELATED APPLICATIONS

This application claims the benefit of Japanese Patent Application No. 2011-236615, filed Oct. 28, 2011.

TECHNICAL FIELD

The invention disclosed in this specification and the like relates to imaging devices.

BACKGROUND ART

By the development of semiconductor devices and their peripheral technologies, imaging devices have been increased in functionality and reduced in size. One of applications of imaging devices is a photocopier. A conventional and widespread photocopier takes an image of a subject placed on platen glass of the photocopier. When a photocopier with such a structure takes an image of a thick book, a gutter of a page is significantly curved and cannot be in close contact with platen glass; thus, an image of the gutter is distorted or cannot be taken in some cases. Moreover, a book itself might be damaged. The invention disclosed in Patent Document 1 solves such a problem by making platen glass have a generally V-shaped cross section.

REFERENCE

Patent Document 1: Japanese Published Patent Application No. S60-169270

DISCLOSURE OF INVENTION

An object of one embodiment of the present invention is to provide a small imaging device that can take an image of a thick book without distortion of an image of a gutter, and in particular, a thin imaging device having such a function. Another object of one embodiment of the present invention is to improve the portability of an imaging device by reducing the size of the imaging device.

One embodiment of the present invention is an imaging device having imaging planes on both surfaces. In one embodiment of the present invention, all elements (light-emitting elements and light-receiving elements) included in the imaging device are preferably provided over one substrate.

According to one embodiment of the present invention, an imaging device includes a first substrate including a light-emitting element and a light-receiving element over one surface, and a second substrate whose one surface faces the one surface of the first substrate. A surface of the second substrate opposite to the one surface of the second substrate is a first imaging plane. A surface of the first substrate opposite to the one surface of the first substrate is a second imaging plane. Some layers included in the light-emitting element and the light-receiving element are formed using a same layer.

In one embodiment of the present invention, the imaging device having the above structure is configured to perform the following operations. Light emitted from a first light-emitting element provided over a first light-blocking film is directed to a first subject facing the first imaging plane. Light reflected from the first subject is detected by a first light-receiving element provided over the first light-blocking film. Light emitted from a second light-emitting element provided below a second light-blocking film is directed to a second subject facing the second imaging plane. Light reflected from the second subject is detected by a second light-receiving element provided below the second light-blocking film.

In one embodiment of the present invention, the imaging device having the above structure is configured to perform the following operations. Light emitted from a first light-emitting element is directed to a first subject facing the first imaging plane. Light reflected from the first subject is detected by a first light-receiving element. Light emitted from a second light-emitting element is directed to a second subject facing the second imaging plane. Light reflected from the second subject is detected by a second light-receiving element. The light reflected from the second subject is also detected by the first light-receiving element.

In one embodiment of the present invention, the imaging device having the above structure is configured to perform the following operations. Light emitted from a first light-emitting element is directed to a first subject facing the first imaging plane. Light reflected from the first subject is detected by a first light-receiving element. Light emitted from a second light-emitting element is directed to a second subject facing the second imaging plane. The light reflected from the first subject and light reflected from the second subject are detected by a second light-receiving element. The light reflected from the second subject is also detected by the first light-receiving element.

In one embodiment of the present invention, the imaging device having the above structure is configured to perform the following operations. Light emitted from a first light-emitting element provided over a first light-blocking film is directed to a first subject facing the first imaging plane. Light emitted from a second light-emitting element provided below a second light-blocking film is directed to a second subject facing the second imaging plane. Light reflected from the first subject and light reflected from the second subject are detected by one light-receiving element.

In one embodiment of the present invention, the imaging device having the above structure is configured to perform the following operations. Light emitted from the light-emitting element is directed to a first subject and a second subject through the first imaging plane and the second imaging plane. Light reflected from the first subject is detected by a first light-receiving element provided over a first light-blocking film. Light reflected from the second subject is detected by a second light-receiving element provided below a second light-blocking film.

In one embodiment of the present invention, the imaging device having the above structure is configured to perform the following operations. Light emitted from the light-emitting element is directed to a first subject and a second subject through the first imaging plane and the second imaging plane. Light reflected from the first subject and light reflected from the second subject are detected by a first light-receiving element. The light reflected from the second subject is detected by a second light-receiving element.

According to one embodiment of the present invention, an imaging device can be downsized. Specifically, an imaging device can be thin because some layers included in all elements (light-emitting elements and light-receiving elements) constituting the imaging device are formed using the same layer. Moreover, the portability of an imaging device can be improved.

BRIEF DESCRIPTION OF DRAWINGS

In the accompanying drawings:

FIG. 13 illustrates an example of a cross section of a pixel in an imaging device according to one embodiment of the present invention.

BEST MODE FOR CARRYING OUT THE INVENTION

Figure 1:
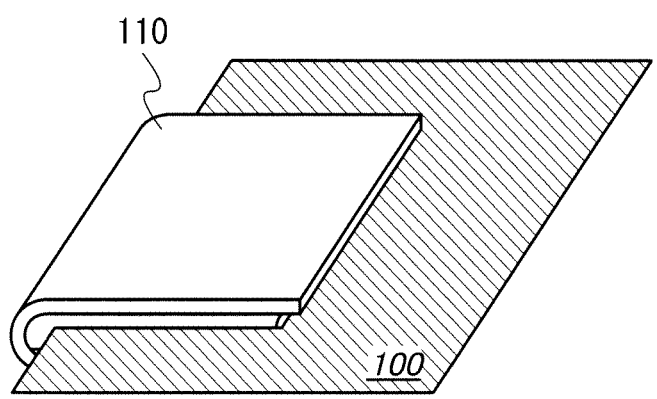
FIG. 1 illustrates a usage example of an imaging device according to one embodiment of the present invention.

Examples of embodiments of the present invention will be described below with reference to the accompanying drawings. Note that the present invention is not limited to the following description, and it will be easily understood by those skilled in the art that various changes and modifications can be made without departing from the spirit and scope of the present invention. Thus, the present invention should not be interpreted as being limited to the following description of the embodiments. In description with reference to drawings, the same reference numerals are sometimes used in common for the same portions in different drawings. Further, in some cases, similar parts are denoted by the same hatching patterns and are not necessarily designated by reference numerals.

Note that the drawings used for description are schematic diagrams; thus, scales are not necessarily limited to those illustrated in the diagrams.

Embodiment 1

FIG. 1 illustrates an imaging device according to one embodiment of the present invention and its usage example. Imaging planes of an imaging device 100 are placed on both surfaces. That is, the imaging device 100 has a first imaging plane (a front face of the imaging device 100 in FIG. 1) and a second imaging plane (a back face of the imaging device 100 in FIG. 1) facing opposite to the first imaging plane. Since the imaging planes of the imaging device 100 are positioned on the opposite sides, when the imaging device 100 is sandwiched between desired pages of a book 110, images of two planes can be taken at one time. Note that a thick book is illustrated as the book 110 here; however, the book 110 is not limited thereto. Even if the book 110 is a thin book, when the imaging device 100 is sandwiched between desired pages of the book 110, images of two planes can be taken at one time.

Figure 2:
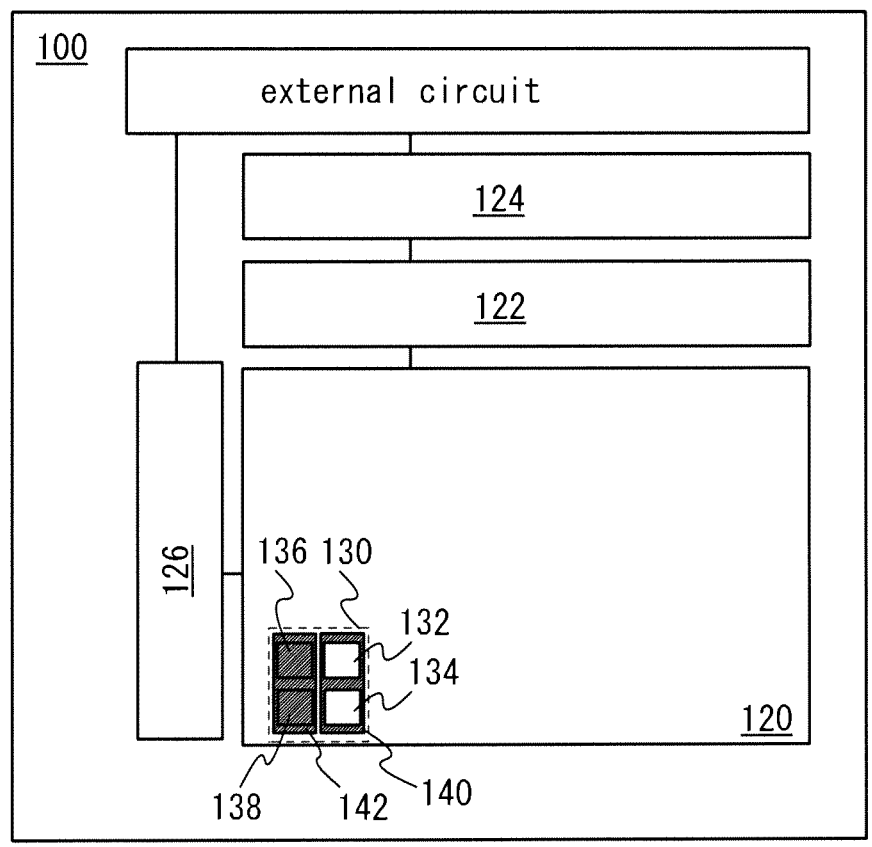
FIG. 2 is a block diagram illustrating a structure of an imaging device according to one embodiment of the present invention.

FIG. 2 is a block diagram illustrating an example of the structure of the imaging device 100. The imaging device 100 includes an imaging region 120, a first driver circuit 122, a read circuit 124, and a second driver circuit 126.

The first driver circuit 122 and the second driver circuit 126 control signals transmitted to the imaging region 120. The read circuit 124 reads data detected by light reception of light-receiving elements in the imaging region 120. The first driver circuit 122, the read circuit 124, and the second driver circuit 126 are connected to an external circuit.

In the imaging region 120, pixels 130 are arranged in a matrix. The pixel 130 includes a first light-emitting element 132, a first light-receiving element 134, a second light-emitting element 136, a second light-receiving element 138, a first light-blocking film 140, and a second light-blocking film 142.

The first light-blocking film 140 is provided below the first light-emitting element 132 and the first light-receiving element 134 (on the back side of the diagram). The second light-blocking film 142 is provided over the second light-emitting element 136 and the second light-receiving element 138 (on the front side of the diagram). Thus, light from the first light-emitting element 132 is directed upward (toward the front of the diagram), and light from the second light-emitting element 136 is directed downward (toward the back of the diagram). The first light-receiving element 134 detects light from above (from the front side of the diagram), and the second light-receiving element 138 detects light from underneath (from the back side of the diagram).

With the structure illustrated in FIG. 2, the imaging device 100 can direct light both upward and downward (toward the front and back of the diagram) and can receive light from both of the sides. Consequently, the imaging device 100 can take images with both surfaces.

In one embodiment of the present invention, all of light-emitting elements and light-receiving elements included in the imaging device 100 are preferably provided over one substrate. A mode in which light-emitting elements and light-receiving elements included in the imaging device 100 are all provided over one substrate will be described below.

Figure 3:
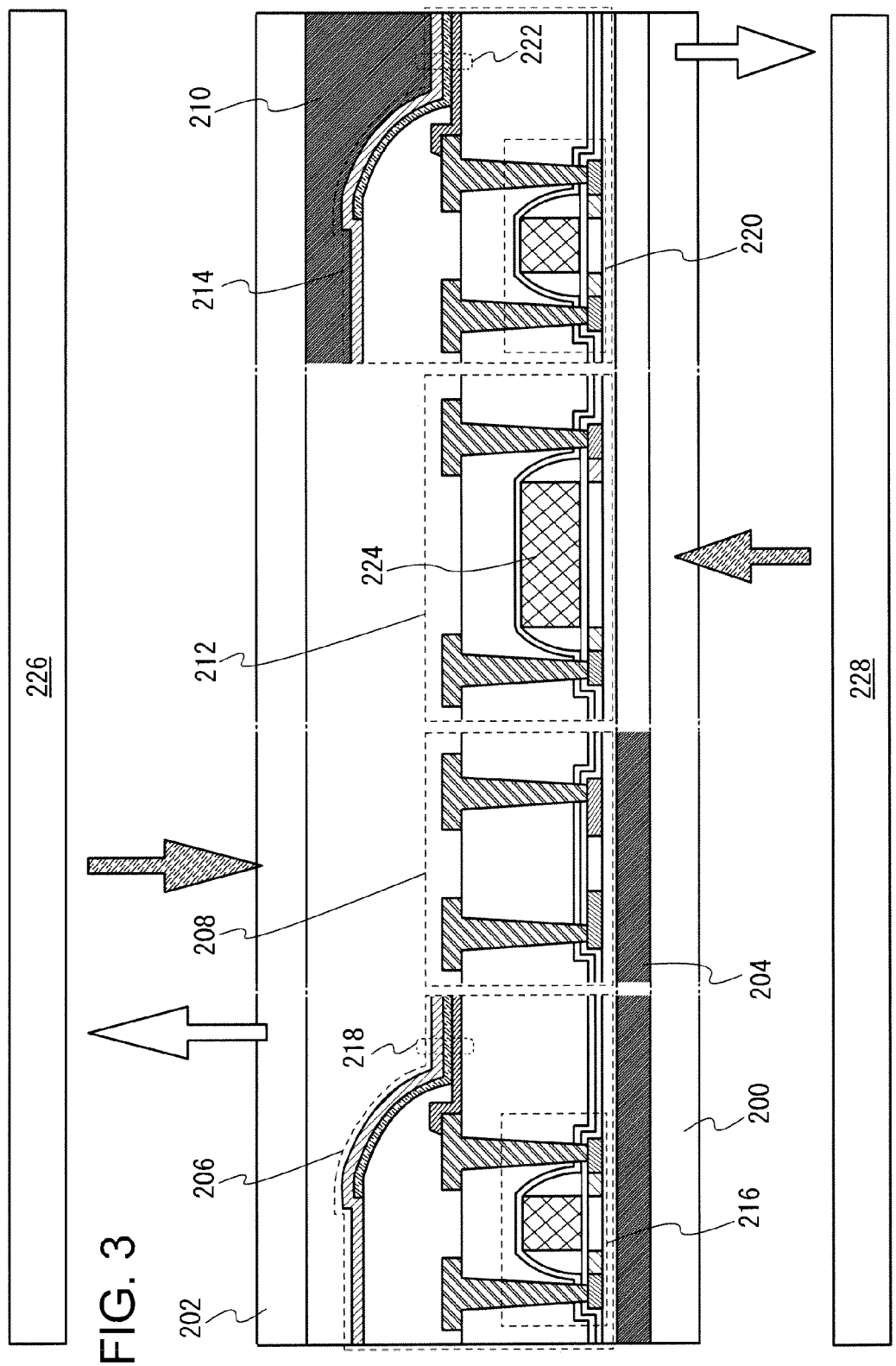
FIG. 3 illustrates an example of a cross section of a pixel in an imaging device according to one embodiment of the present invention.

FIG. 3 illustrates a mode in which light-emitting elements and light-receiving elements included in the imaging device are all provided over a substrate 200. The light-emitting elements are sealed with a sealing substrate 202. The imaging device illustrated in FIG. 3 is configured to perform the following operations. Light emitted from a first light-emitting element 206 provided over a first light-blocking film 204 is directed to a first subject 226 facing a first imaging plane. Light reflected from the first subject 226 is detected by a first light-receiving element 208 provided over the first light-blocking film 204. Light emitted from a second light-emitting element 214 provided below a second light-blocking film 210 is directed to a second subject 228 facing a second imaging plane. Light reflected from the second subject 228 is detected by a second light-receiving element 212 that is provided to overlap with a third light-blocking film 224.

The first light-emitting element 206 in FIG. 3 corresponds to the first light-emitting element 132 in FIG. 2. The first light-receiving element 208 in FIG. 3 corresponds to the first light-receiving element 134 in FIG. 2. The second light-emitting element 214 in FIG. 3 corresponds to the second light-emitting element 136 in FIG. 2. The second light-receiving element 212 in FIG. 3 corresponds to the second light-receiving element 138 in FIG. 2. The first light-blocking film 204 in FIG. 3 corresponds to the first light-blocking film 140 in FIG. 2. The second light-blocking film 210 in FIG. 3 corresponds to the second light-blocking film 142 in FIG. 2.

The operation of the imaging device illustrated in FIG. 3 will be described. Light emitted from the first light-emitting element 206 is directed to the first subject 226 and partly reflected, and the reflected light is received by the first light-receiving element 208. An image of the first subject 226 is taken with the light received by the first light-receiving element 208. Light emitted from the second light-emitting element 214 is directed to the second subject 228 and partly reflected, and the reflected light is received by the second light-receiving element 212. An image of the second subject 228 is taken with the light received by the second light-receiving element 212.

The imaging device illustrated in FIG. 3 can take images of the first subject 226 and the second subject 228 independently and has high layout flexibility. Moreover, the imaging device can take an image of only one of the first subject 226 and the second subject 228, as well as taking images of both the first subject 226 and the second subject 228 at the same time.

There is no particular limitation on the substrate 200 as long as it has at least light-transmitting properties. Examples of the substrate 200 are a glass substrate, a quartz substrate, and a plastic substrate. As the sealing substrate 202, a substrate similar to the substrate 200 can be used.

The first light-blocking film 204 and the second light-blocking film 210 are formed using a material with light-blocking properties. An example of the material with light-blocking properties is metal, and chromium, chromium oxide, or the like is preferably used. Another example of the material with light-blocking properties is black resin. It is preferable that the first light-blocking film 204 be formed using chromium, chromium oxide, or the like and the second light-blocking film 210 be formed using a material with light-blocking properties, such as black resin.

The first light-emitting element 206 is a top-emission light-emitting element including a first transistor 216 and a first light-emitting portion 218. The second light-emitting element 214 is a bottom-emission light-emitting element including a second transistor 220 and a second light-emitting portion 222.

The first transistor 216 and the second transistor 220 control light emission/non-light emission of the first light-emitting element 206 and the second light-emitting element 214, and control the amount of current flowing to the first light-emitting portion 218 of the first light-emitting element 206 and the second light-emitting portion 222 of the second light-emitting element 214, respectively.

There is no particular limitation on the structure of the first transistor 216 and the second transistor 220, and semiconductor layers included in these transistors may be a single crystal semiconductor, a polycrystalline semiconductor, or an amorphous semiconductor. Further, a material used for the semiconductor layers included in the transistors can be silicon, germanium, silicon germanium, or an oxide semiconductor. The semiconductor layers are composed of preferably a single crystal semiconductor, and most preferably single crystal silicon.

An example of a method for fabricating a single crystal semiconductor layer will be described.

First, an ion beam is injected into a single crystal semiconductor substrate to form a fragile layer which is locally weakened at a certain depth from the surface of the semiconductor substrate. The depth at which the fragile layer is formed is determined by the acceleration energy of the ion beam and the angle at which the ion beam enters.

Next, a surface of the semiconductor substrate including the fragile layer is attached to a surface of an insulating film provided on the substrate 200 to join together. The joint can be made by applying a pressure of approximately 1 N/cm$^2$ to 500 N/cm$^2$, preferably 11 N/cm$^2$ to 20 N/cm$^2$ in the direction perpendicular to the joint surface of the semiconductor substrate and the substrate 200.

After that, heat treatment is performed at a temperature higher than or equal to the temperature at which microvoids in the fragile layer are bonded and lower than the strain point of the substrate 200. By the heat treatment, microvoids in the fragile layer are bonded to each other and part of the semiconductor substrate is separated from the rest of the semiconductor substrate along the fragile layer, so that a single crystal semiconductor film is formed. Then, the single crystal semiconductor film is processed to form a single crystal semiconductor layer.

In each of the first light-emitting portion 218 and the second light-emitting portion 222, an EL layer is placed between an anode and a cathode.

The anode is an electrode formed using a metal, an alloy, an electrically conductive compound, a mixture thereof, or the like with a high work function (specifically, a work function of 4.0 eV or more). Examples of such a material are indium oxide-tin oxide, indium oxide-tin oxide containing silicon or silicon oxide, indium oxide-zinc oxide, and indium oxide containing tungsten oxide and zinc oxide. Alternatively, Au, Pt, Ni, W, Cr, Mo, Fe, Co, Cu, Pd, Ti, or nitride thereof (e.g., titanium nitride) may be used, for example. The anode can be formed by forming a film of such a material by sputtering or the like and then processing the film.

Note that it is possible that only part of the anode is formed in a comb-shape by using a transparent conductive material and a reflective electrode is provided as the other part so that these transparent portions and reflective portions alternately engage with each other.

There is no particular limitation on a material and a method for forming the EL layer. For the EL layer, a known substance can be used, and either a low molecular compound or a high molecular compound can be used. Note that the EL layer is preferably configured to emit white light because an image can be taken based on the emitted light. The EL layer includes a hole-injection layer, a hole-transport layer provided over the hole-injection layer, a light-emitting layer provided over the hole-transport layer, an electron-transport layer provided over the light-emitting layer, and an electron-injection layer provided over the electron-transport layer.

For the hole-injection layer, either a low molecular compound or a high molecular compound can be used. Examples of the low molecular compound are 4,4',4''-tris(N,N-diphenylamino)triphenylamine (TDATA), 4,4',4''-tris[N-(3-methylphenyl)-N-phenylamino]triphenylamine (MTDATA), 4,4'-bis[N-(4-diphenylaminophenyl)-N-phenylamino]biphenyl (DPAB), 4,4'-bis(N-{4-[N'-(3-methylphenyl)-N'-phenylamino]phenyl}-N-phenylamino)biphenyl (DNTPD), 1,3,5-tris[N-(4-diphenylaminophenyl)-N-phenylamino]benzene (DPA3B), 3-[N-(9-phenylcarbazol-3-yl)-N-phenylamino]-9-phenylcarbazole (PCzPCA1), 3,6-bis[N-(9-phenylcarbazol-3-yl)-N-phenylamino]-9-phenylcarbazole (PCzPCA2), 3-[N-(1-naphthyl)-N-(9-phenylcarbazol-3-yl)amino]-9-phenylcarbazole (PCzPCN1), and 2-tert-butyl-9,10-di(2-naphthyl)anthracene (t-BuDNA).

Examples of the high molecular compound include oligomer, dendrimer, and polymer. For example, any of the following high molecular compounds can be used: poly(N-vinylcarbazole) (PVK), poly(4-vinyltriphenylamine) (PVTPA), poly[N-(4-{N'-[4-(4-diphenylamino)phenyl]phenyl-N'-phenylamino}phenyl)methacrylamide] (PTPDMA), and poly[N,N-bis(4-butylphenyl)-N,N-bis(phenyl)benzidine] (Poly-TPD).

The hole-transport layer is a layer containing a substance with a high hole-transport property (preferably having a hole mobility of $10^{-6}$ cm$^2$/Vs or higher). Examples of the substance with a high hole-transport property are aromatic amine compounds such as NPB, TPD, BPAFLP, 4,4'-bis[N-(9,9-dimethylfluoren-2-yl)-N-phenylamino]biphenyl (DFLD-PBi), and 4,4'-bis[N-(spiro-9,9'-bifluoren-2-yl)-N-phenylamino]biphenyl (BSPB). The substances mentioned here are mainly ones that have a hole mobility of $10^{-6}$ cm$^2$/Vs or higher. Note that a substance other than the above-described substances may also be used as long as the substance has a hole-transport property higher than an electron-transport property. The layer containing a substance with a high hole-transport property may be a single layer or a stack of two or more layers containing any of the above substances.

Alternatively, a carbazole derivative such as CBP, CzPA, or PCzPA or an anthracene derivative such as t-BuDNA, DNA, or DPAnth may be used for the hole-transport layer.

Further alternatively, a high molecular compound such as PVK, PVTPA, PTPDMA, or Poly-TPD can be used for the hole-transport layer.

The light-emitting layer contains a light-emitting substance. As the light-emitting substance, a fluorescent compound that exhibits fluorescence or a phosphorescent compound that exhibits phosphorescence can be used, for example. Examples of a fluorescent material for blue light emission, which can be used for the light-emitting layer, are N,N'-bis[4-(9H-carbazol-9-yl)phenyl]-N,N'-diphenylstilbene-4,4'-diamine (YGA2S), 4-(9H-carbazol-9-yl)-4'-(10-phenyl-9-anthryl)triphenylamine (YGAPA), and 4-(10-phenyl-9-anthryl)-4'-(9-phenyl-9H-carbazol-3-yl)triphenylamine (PCBAPA). Examples of a fluorescent material for green light emission are N-(9,10-diphenyl-2-anthryl)-N,9-diphenyl-9H-carbazol-3-amine (2PCAPA), N-[9,10-bis(1,1'-biphenyl-2-yl)-2-anthryl]-N,9-diphenyl-9H-carbazol-3-amine (2P CABPhA), N-(9,10-diphenyl-2-anthryl)-N,N',N'-triphenyl-1,4-phenylenediamine (2DPAPA), N-[9,10-bis(1,1'-biphenyl-2-yl)-2-anthryl]-N,N',N'-triphenyl-1,4-phenylenediamine (2DPABPhA), N-[9,10-bis(1,1'-biphenyl-2-yl)]-N-[4-(9H-carbazol-9-yl)phenyl]-N-phenylanthracen-2-amine (2YGABPhA), and N,N,9-triphenylanthracen-9-amine (DPhAPhA). Examples of a florescent material for yellow light emission are rubrene and 5,12-bis(1,1'-biphenyl-4-yl)-6,11-diphenyltetracene (BPT). Examples of a florescent material for red light emission are N,N,N',N'-tetrakis(4-methylphenyl)tetracene-5,11-diamine (p-mPhTD) and 7,14-diphenyl-N,N,N',N'-tetrakis(4-methylphenyl)acenaphtho[1,2-α]fluoranthene-3,10-diamine (p-mPhAFD).

Examples of a phosphorescent material for green light emission, which can be used for the light-emitting layer, are tris(2-phenylpyridinato-N,C$^{2'}$)iridium(III) (Ir(ppy)$_3$), bis(2-phenylpyridinato-N,C$^{2'}$) iridium(III) acetylacetonate (Ir(ppy)$_2$(acac)), bis(1,2-diphenyl-1H-benzimidazolato)iridium(III) acetylacetonate (Ir(pbi)$_2$(acac)), bis(benzo[h]quinolinato)iridium(III) acetylacetonate (Ir(bzq)$_2$(acac)), and tris(benzo[h]quinolinato)iridium(III) (Ir(bzq)$_3$). Examples of a phosphorescent material for yellow light emission are bis(2,4-diphenyl-1,3-oxazolato-N,C$^{2'}$)iridium(III) acetylacetonate (Ir(dpo)$_2$(acac)), bis{2-[4'-(perfluorophenyl)phenyl]pyridinato-N,C$^{2'}$}iridium(III) acetylacetonate (Ir(p-PF-ph)$_2$(acac)), bis(2-phenylbenzothiazolato-N,C$^{2'}$)iridium(III) acetylacetonate (Ir(bt)$_2$(acac)), (acetylacetonato)bis[2,3-bis(4-fluorophenyl)-5-methylpyrazinato]iridium(III) (Ir(Fdppr-Me)$_2$(acac)), and (acetylacetonato)bis{2-(4-methoxyphenyl)-3,5-dimethylpyrazinato}iridium(III) (Ir(dmmoppr)$_2$(acac)). Examples of a phosphorescent material for orange light emission are tris(2-phenylquinolinato-N,C$^{2'}$)iridium(III) (Ir(pq)$_3$), bis(2-phenylquinolinato-N,C$^{2'}$)iridium(III) acetylacetonate (Ir(pq)$_2$(acac)), (acetylacetonato)bis(3,5-dimethyl-2-phenylpyrazinato) iridium(III) (Ir(mppr-Me)$_2$(acac)), and (acetylacetonato)bis(5-isopropyl-3-methyl-2-phenylpyrazinato) iridium(III) (Ir(mppr-iPr)$_2$(acac)). Examples of a phosphorescent material for red light emission include the following organometallic complexes: bis[2-(2'-benzo[4,5-α]thienyl)pyridinato-N,C$^{3'}$]iridium(III) acetylacetonate (Ir(btp)$_2$(acac)), bis(1-phenylisoquinolinato-N,C$^{2'}$)iridium(III) acetylacetonate (Ir(piq)$_2$(acac)), (acetylacetonato)bis[2,3-bis(4-fluorophenyl)quinoxalinato]iridium(III) (Ir(Fdpq)$_2$(acac)), (acetylacetonato)bis(2,3,5-triphenylpyrazinato)iridium(III) (Ir(tppr)$_2$(acac)), (dipivaloylmethanato)bis(2,3,5-triphenylpyrazinato)iridium(III) (Ir(tppr)$_2$(dpm)), and 2,3,7,8,12,13,17,18-octaethyl-21H,23H-porphyrin platinum(II) (PtOEP). In addition, a rare earth metal complex such as tris(acetylacetonato)(monophenanthroline)terbium(III) (Tb(acac)$_3$(Phen)), tris(1,3-diphenyl-1,3-propanedionato)(monophenanthroline) europium(III) (Eu(DBM)$_3$(Phen)), or tris[1-(2-thenoyl)-3,3,3-trifluoroacetonato](monophenanthroline)europium(III) (Eu(TTA)$_3$(Phen)) exhibits light emission from a rare earth metal ion (electron transition between different multiplicities), and thus can be used as a phosphorescent compound.

Alternatively, a high molecular compound may be used as the light-emitting substance. Specific examples of a light-emitting material for blue light emission are poly(9,9-dioctylfluorene-2,7-diyl) (PFO), poly[(9,9-dioctylfluorene-2,7-diyl-co-(2,5-dimethoxybenzene-1,4-diyl)] (PF-DMOP), and poly{(9,9-dioctylfluorene-2,7-diyl)-co-[N,N'-di-(p-butylphenyl)-1,4-diaminobenzene]} (TAB-PFH). Examples of a light-emitting material for green light emission are polyp-phenylenevinylene) (PPV), poly[(9,9-dihexylfluorene-2,7-diyl)-alt-co-(benzo[2,1,3]thiadiazole-4,7-diyl)] (PFBT), and poly[(9,9-dioctyl-2,7-divinylenfluorenylene)-alt-co-(2-methoxy-5-(2-ethylhexyloxy)-1,4-phenylene)]. Examples of a light-emitting material for orange to red light emission are poly[2-methoxy-5-(2'-ethylhexoxy)-1,4-phenylenevinylene] (MEH-PPV), poly(3-butylthiophene-2,5-diyl) (R4-PAT), poly{[9,9-dihexyl-2,7-bis(1-cyanovinylene)fluorenylene]-alt-co-[2,5-bis(N,N'-diphenyl amino)-1,4-phenylene]}, and poly{[2-methoxy-5-(2-ethylhexyloxy)-1,4-bis(1-cyanovinylenephenylene)]-alt-co-[2,5-bis(N,N'-diphenylamino)-1,4-phenylene]} (CN-PPV-DPD).

When a plurality of layers each containing a light-emitting organic compound are provided and the emission colors of the layers are made different, light emission of a desired color can be obtained from the light-emitting element as a whole. For example, in a light-emitting element including two layers each containing a light-emitting organic compound, when the emission color of a first layer containing a light-emitting organic compound and the emission color of a second layer containing a light-emitting organic compound are made complementary, the light-emitting element as a whole can emit white light. Note that "complementary colors" refer to colors that can produce an achromatic color when mixed. That is, white light emission can be obtained by mixture of complementary color lights emitted from substances. This can be applied to a light-emitting element including three or more layers each containing a light-emitting organic compound.

The electron-transport layer is a layer containing a substance with a high electron-transport property (preferably having an electron mobility of $10^{-6}$ cm$^2$/Vs or higher). Examples of the substance with a high electron-transport property are the following metal complexes: Alq$_3$, tris(4-methyl-8-quinolinolato)aluminum (Almq$_3$), bis(10-hydroxybenzo[h]-quinolinato)beryllium (BeBq$_2$), BAlq, Zn(BOX)$_2$, and bis[2-(2-hydroxyphenyl)benzothiazolato] zinc (Zn(BTZ)$_2$). Other examples are heteroaromatic compounds such as 2-(4-biphenylyl)-5-(4-tert-butylphenyl)-1,3, 4-oxadiazole (PBD), 1,3-bis[5-(p-tert-butylphenyl)-1,3,4-oxadiazol-2-yl]benzene (OXD-7), 3-(4-tert-butylphenyl)-4-phenyl-5-(4-biphenylyl)-1,2,4-triazole (TAZ), 3-(4-tert-butylphenyl)-4-(4-ethylphenyl)-5-(4-biphenylyl)-1,2,4-triazole (p-EtTAZ), bathophenanthroline (BPhen), bathocuproine (BCP), and 4,4'-bis(5-methylbenzoxazol-2-yl)stilbene (BzOs); and high molecular compounds such as poly(2,5-pyridinediyl) (PPy), poly[(9,9-dihexylfluoren-2,7-diyl)-co-(pyri din-3,5-diyl)] (PF-Py), and poly[(9,9-dioctylfluoren-2,7-diyl)-co-(2,2'-bipyridin-6,6'-diyl)] (PF-BPy). Note that a substance other than the above-mentioned materials may be used for the electron-transport layer as long as the substance has a higher electron-transport property than a hole-transport property.

Furthermore, the electron-transport layer is not limited to a single layer and may be a stack of two or more layers containing any of the above substances.

The electron-injection layer is a layer containing a substance with a high electron-injection property. The electron-injection layer can be formed using an alkali metal, an alkaline earth metal, or a compound thereof, such as lithium, cesium, calcium, lithium fluoride, cesium fluoride, calcium fluoride, or lithium oxide. Alternatively, the electron-injection layer may be formed using a rare earth metal compound such as erbium fluoride or any of the substances used for forming the electron-transport layer.

The cathode can be formed using a metal, an alloy, an electrically conductive compound, a mixture thereof, or the like having a low work function (specifically, a work function of 3.8 eV or lower). Specific examples of such a material are an element belonging to Group 1 or 2 of the periodic table, that is, an alkali metal such as Li or Cs, an alkaline earth metal such as Mg, Ca, or Sr, an alloy containing any of these metals (e.g., MgAg or AlLi), a rare earth metal such as Eu or Yb, and an alloy containing such a rare earth metal.

Note that in the case where the cathode is formed using an alkali metal, an alkaline earth metal, or an alloy thereof, a vacuum evaporation method or a sputtering method can be used. Alternatively, in the case of using a silver paste or the like, a coating method, an inkjet method, or the like may be used.

Note that the EL layer needs to include at least the hole-injection layer and the light-emitting layer, and does not necessarily include the electron-injection layer, the electron-transport layer, and the hole-transport layer.

The first light-receiving element 208 and the second light-receiving element 212 may have a lateral junction structure in which a p-type region, an i-type region, and an n-type region are provided in one semiconductor layer or a stacked (vertical) structure in which a p-type semiconductor layer, an i-type semiconductor layer, and an n-type semiconductor layer are stacked in this order. Note that the first light-receiving element 208 and the second light-receiving element 212 preferably have a lateral junction structure as illustrated in FIG. 3. Alternatively, the first light-receiving element 208 and the second light-receiving element 212 may be a lateral junction PN element in which a p-type region and an n-type region are provided in one semiconductor layer, or a stacked PN element in which a p-type semiconductor layer and an n-type semiconductor layer are stacked.

Semiconductor layers included in the first light-receiving element 208 and the second light-receiving element 212 may be a single crystal semiconductor, a polycrystalline semiconductor, or an amorphous semiconductor. Moreover, a material used for the semiconductor layers included in these light-receiving elements may be silicon, germanium, or silicon germanium. The semiconductor layers are formed using preferably a single crystal semiconductor, and most preferably single crystal silicon. With the use of a single crystal semiconductor, preferably single crystal silicon, a circuit for controlling the imaging device 100 can also be formed over the substrate 200.

In the case of using a polycrystalline semiconductor, a polycrystalline semiconductor may be obtained by forming an amorphous semiconductor and then crystallizing the amorphous semiconductor by a laser crystallization method or a thermal crystallization method.

Here, the case where the first light-receiving element 208 and the second light-receiving element 212 have a lateral junction structure using single crystal silicon will be described.

The i-type region refers to a region that contains an element imparting one conductivity at a concentration of $1 \times 10^{20}$ cm$^{-3}$ or less (detected by SIMS) and has a photoconductivity 100 times or more higher than its dark conductivity. In other words, the i-type region is a region to which no impurity element imparting one conductivity is intentionally added. Note that in the case where the first light-receiving element 208 and the second light-receiving element 212 are formed at the same time as the transistors, the i-type region may include an impurity element imparting p-type conductivity, which is added by channel doping performed on semiconductor layers of the transistors.

Although differing in the distance between the p-type region and the n-type region (corresponding to the length of the i-type region) in FIG. 3, the first light-receiving element 208 and the second light-receiving element 212 preferably have the same distance between the p-type region and the n-type region (corresponding to the length of the i-type region).

When the first transistor 216 and the second transistor 220 have lightly doped drain (LDD) regions, an LDD region may be provided below a sidewall insulating layer provided in contact with the third light-blocking film 224 of the second light-receiving element 212.

Figure 4:
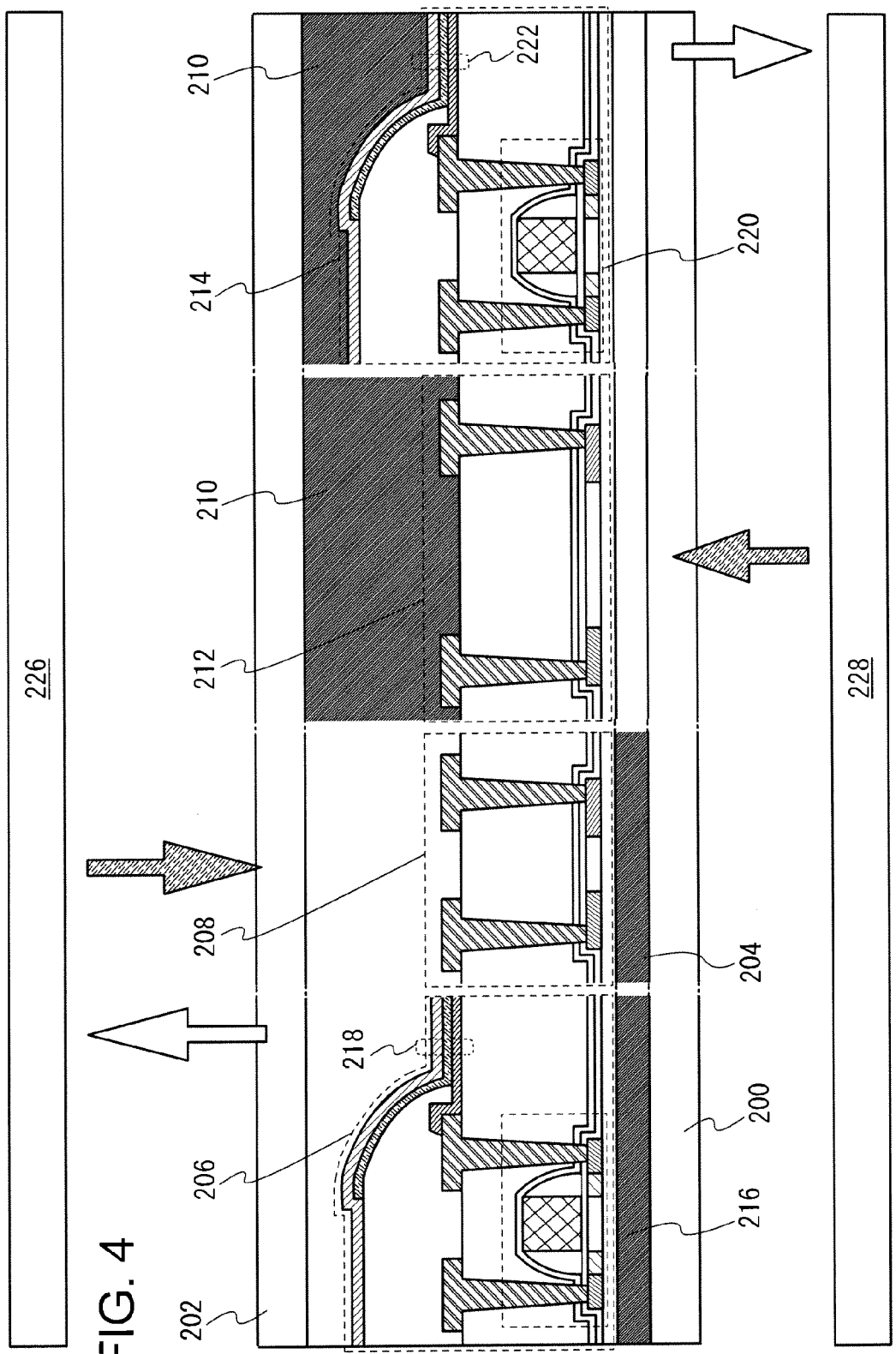
FIG. 4 illustrates an example of a cross section of a pixel in an imaging device according to one embodiment of the present invention.
Figure 6:
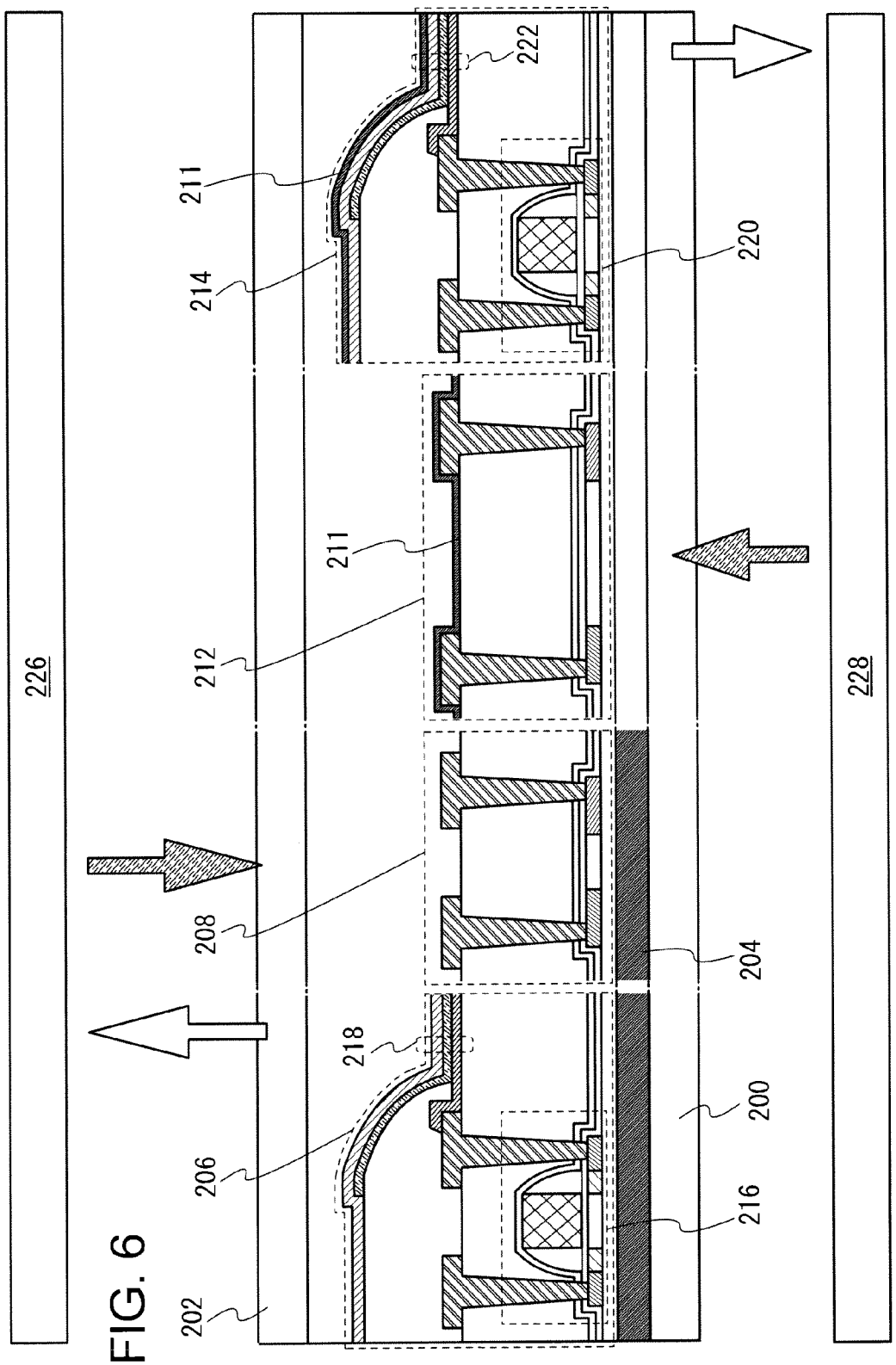
FIG. 6 illustrates an example of a cross section of a pixel in an imaging device according to one embodiment of the present invention.

The third light-blocking film 224 is formed using the same layer as gate electrodes of the first transistor 216 and the second transistor 220 in FIG. 3. However, there is no limitation on the structure, and the second light-blocking film 210 may be provided to overlap the second light-receiving element 212 without providing the third light-blocking film 224 (FIG. 4). Alternatively, a second light-blocking film 211 may be formed over the cathode of the second light-emitting element 214 by sputtering or the like (FIG. 6). In this case, the second light-blocking film 211 is composed of chromium or chromium oxide.

Figure 5:
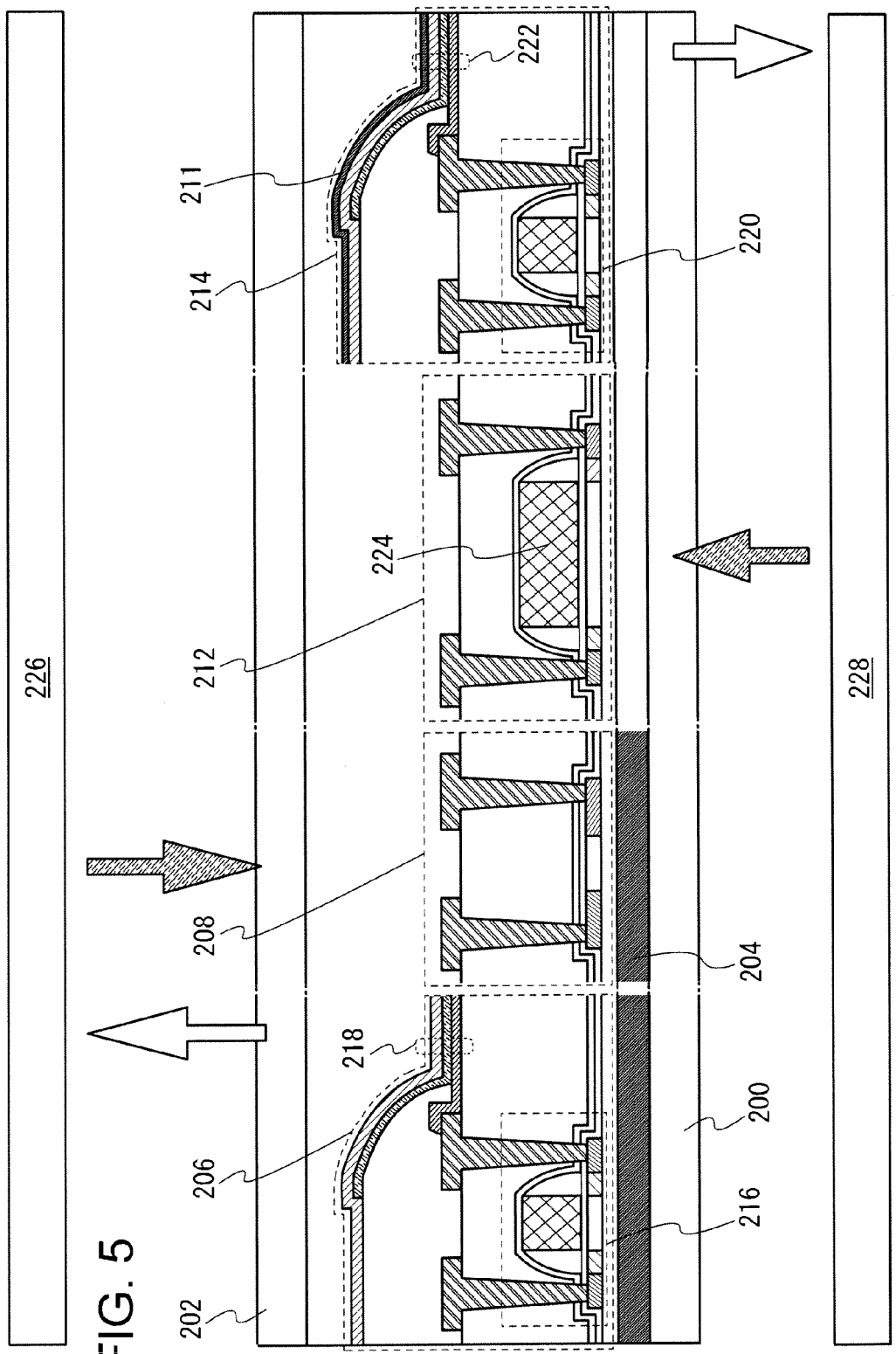
FIG. 5 illustrates an example of a cross section of a pixel in an imaging device according to one embodiment of the present invention.

Alternatively, the second light-blocking film 211 may be formed over the cathode of the second light-emitting element 214 by sputtering or the like after the third light-blocking film 224 is provided (FIG. 5).

The imaging devices illustrated in FIGS. 4 to 6 operate in a manner similar to that of the imaging device in FIG. 3.

The imaging devices illustrated in FIGS. 4 to 6 can take images of the first subject 226 and the second subject 228 independently and have high layout flexibility. Moreover, the imaging devices can take an image of only one of the first subject 226 and the second subject 228, as well as taking images of both the first subject 226 and the second subject 228 at the same time.

The first subject 226 faces the first imaging plane, and the second subject 228 faces the second imaging plane.

With any of the above-described structures, an imaging device that can take images through both surfaces can be achieved.

Embodiment 2

Embodiment 1 explains the mode in which both of the first and second light-receiving elements receive light through only one plane; alternatively, one or both of the first and second light-receiving elements may receive light through both planes. Embodiment 2 will explain a mode in which at least one of the first and second light-receiving elements receives light through both planes.

Figure 7:
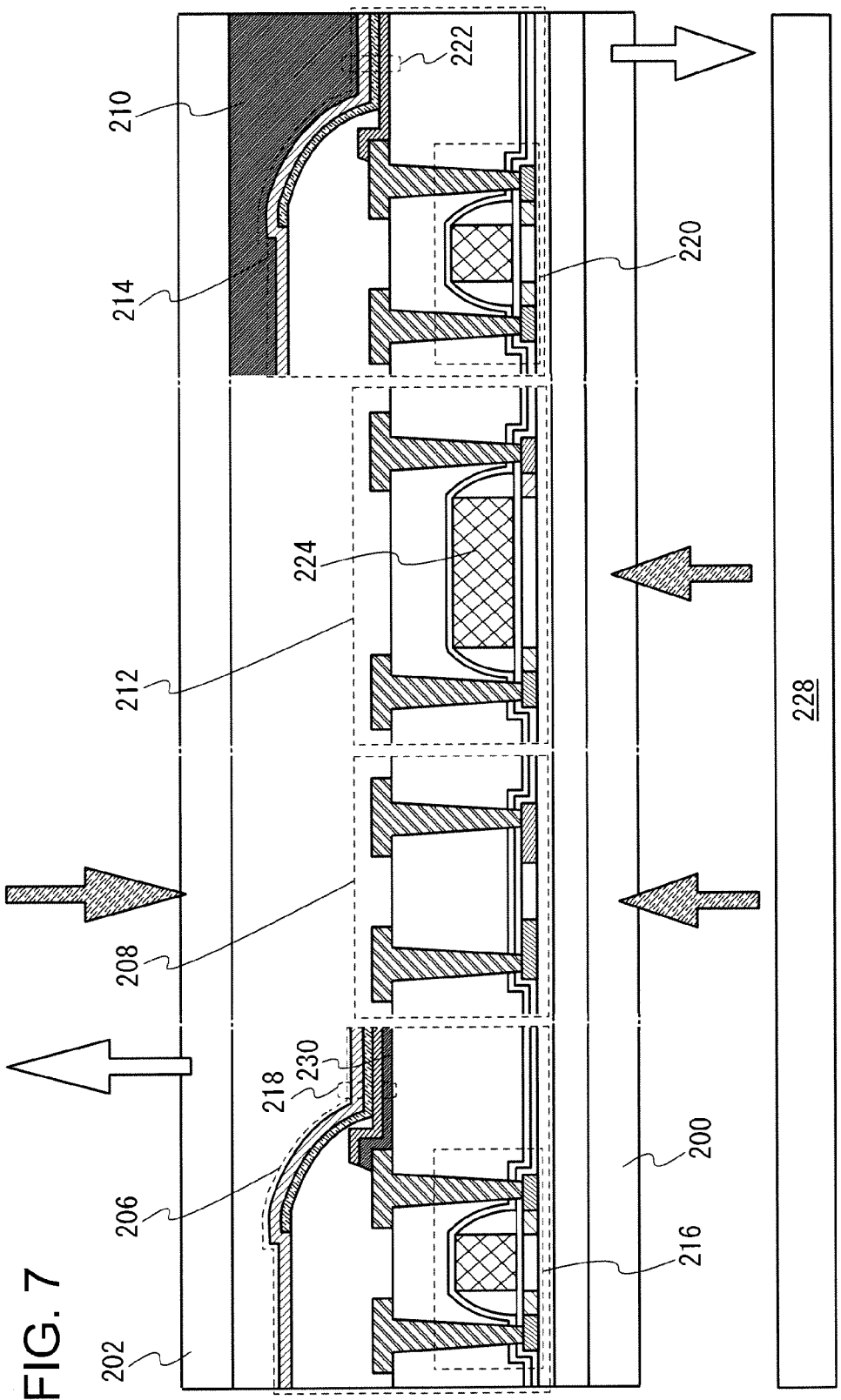
FIG. 7 illustrates an example of a cross section of a pixel in an imaging device according to one embodiment of the present invention.

FIG. 7 illustrates a structure in which the first light-receiving element 208 in FIG. 3 does not overlap the first light-blocking film 204. That is, the first light-receiving element 208 receives light through both planes.

Figure 8:
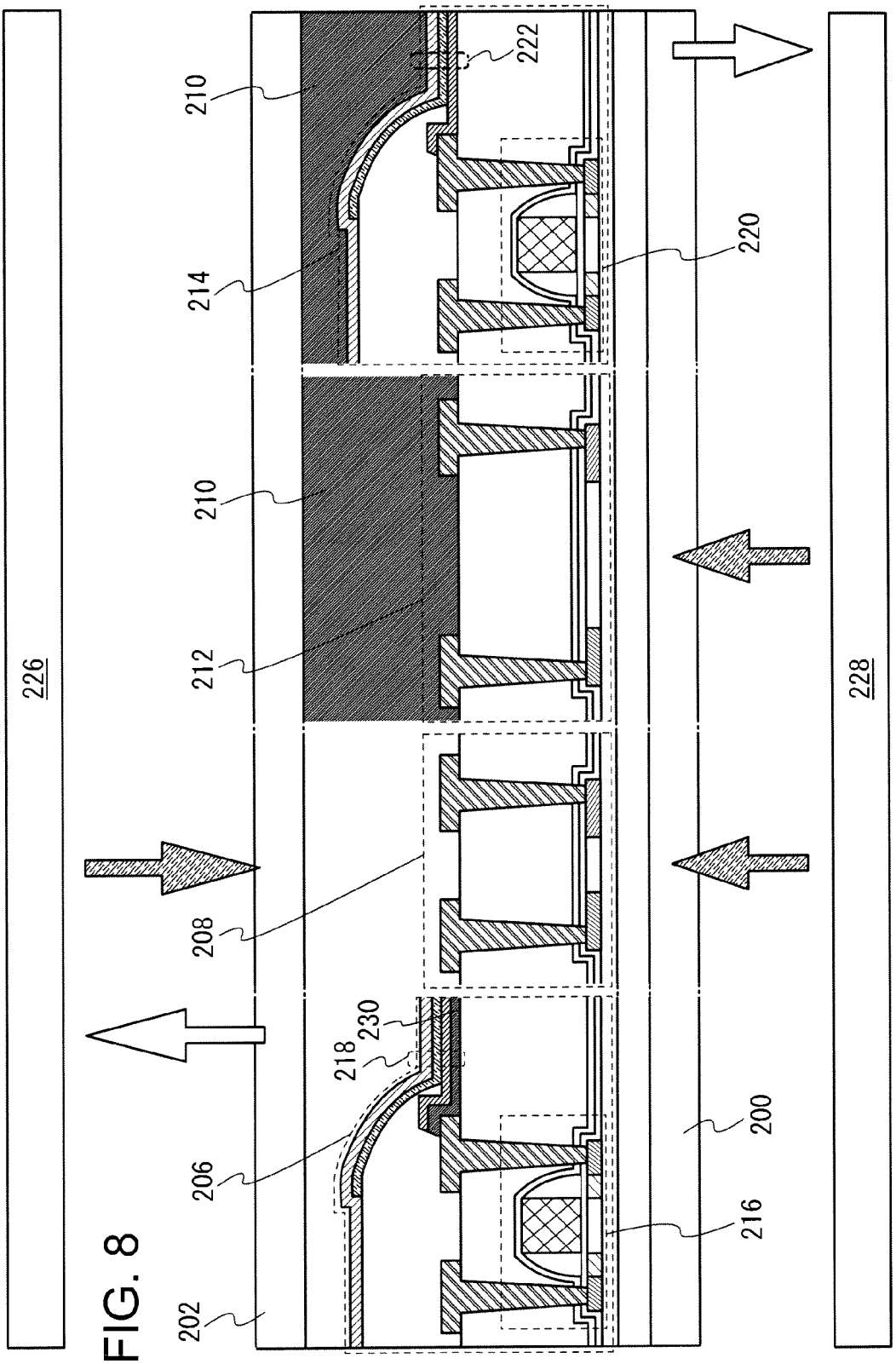
FIG. 8 illustrates an example of a cross section of a pixel in an imaging device according to one embodiment of the present invention.

FIG. 8 illustrates a structure in which the first light-receiving element 208 in FIG. 4 does not overlap the first light-blocking film 204. That is, the first light-receiving element 208 receives light through both planes.

Note that FIGS. 7 and 8 illustrate modes in which the first light-receiving element 208 receives light through both planes and the second light-receiving element 212 receives light through only one of the planes. However, the structure is not limited thereto, and it is possible that the first light-receiving element 208 receives light through only one of the planes and the second light-receiving element 212 receives light through both planes.

The operation of the imaging devices illustrated in FIGS. 7 and 8 will be described. Light emitted from the first light-emitting element 206 is directed to the first subject 226 and partly reflected, and the reflected light is received by the first light-receiving element 208. Light emitted from the second light-emitting element 214 is directed to the second subject 228 and partly reflected, and the reflected light is received by the first light-receiving element 208 and the second light-receiving element 212.

In the case where one of the first light-receiving element 208 and the second light-receiving element 212 receives light through only one of the planes and the other thereof receives light through both planes as illustrated in FIGS. 7 and 8, a differential circuit is used to obtain a difference between a value detected by the element that receives light through both planes and a value detected by the element that receives light through only one of the planes; thus, images can be taken through both planes. The differential circuit may be configured to obtain a difference between photocurrent values (analog values) detected by the light-receiving elements or configured to obtain a difference by using data (digital values) that are obtained by A/D conversion of photocurrent values detected by the light-receiving elements.

In the case of using a differential circuit, a correction circuit is preferably employed because it may be difficult to take an accurate image with light exceeding a predetermined amount when detected values are amplified.

In the imaging devices illustrated in FIGS. 7 and 8, the first light-blocking film 204 in FIGS. 3 and 4 is not needed because a reflective electrode 230 is provided below the first light-emitting element 206. Thus, the imaging devices can be fabricated through a simpler process.

As the reflective electrode 230, a conductive layer in which an indium oxide-tin oxide layer is provided over an Ag layer can be used, for example. Alternatively, the reflective electrode 230 may be formed using the same layer as source and drain electrodes of the first transistor 216 or another conductive layer capable of reflecting light.

Alternatively, both the first light-receiving element 208 and the second light-receiving element 212 may receive light through both planes.

Figure 9:
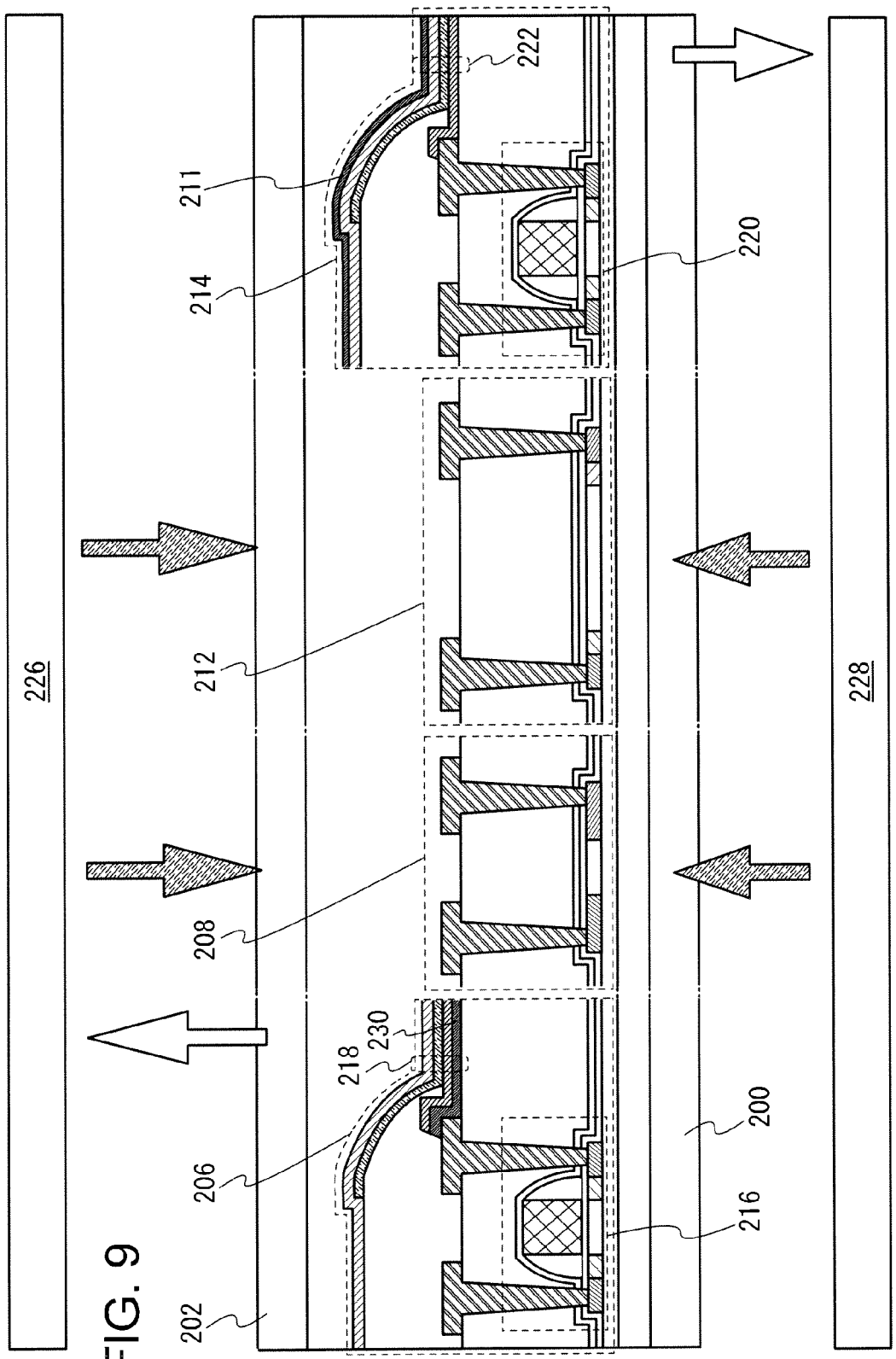
FIG. 9 illustrates an example of a cross section of a pixel in an imaging device according to one embodiment of the present invention.

FIG. 9 illustrates a structure where the first light-receiving element 208 in FIG. 5 does not overlap the first light-blocking film 204 and the third light-blocking film 224 does not overlap the second light-receiving element 212, in other words, a structure where the first light-receiving element 208 in FIG. 6 does not overlap the first light-blocking film 204 and the second light-blocking film 211 does not overlap the second light-receiving element 212. That is, the first light-receiving element 208 and the second light-receiving element 212 receive light through both planes.

The operation of the imaging device illustrated in FIG. 9 will be described. Light emitted from the first light-emitting element 206 is directed to the first subject 226 and partly reflected, and the reflected light is received by the first light-receiving element 208 and the second light-receiving element 212. Light emitted from the second light-emitting element 214 is directed to the second subject 228 and partly reflected, and the reflected light is received by the first light-receiving element 208 and the second light-receiving element 212. The first subject 226 can be detected from values that the light-receiving elements detect while the first light-emitting element 206 emits light, and the second subject 228 can be detected from values that the light-receiving elements detects while the second light-emitting element 214 emits light.

In the imaging device illustrated in FIG. 9, the first light-blocking film 204 in FIGS. 5 and 6 is not needed because the reflective electrode 230 is provided below the first light-emitting element 206. Thus, the imaging device can be fabricated through a simpler process.

As described above, an imaging device may employ a mode in which at least one of the first light-receiving element and the second light-receiving element receives light through both planes.

Figure 10:
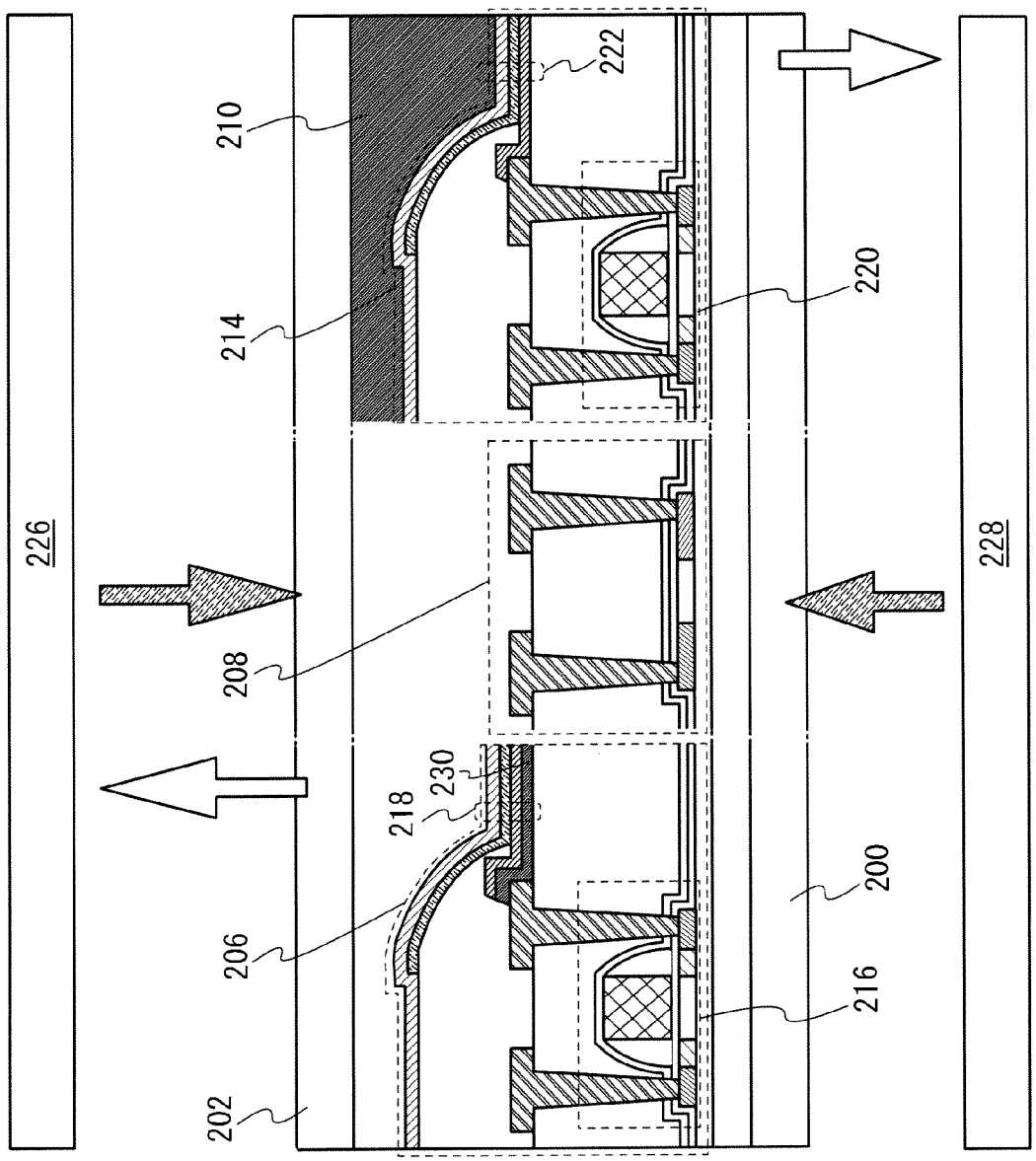
FIG. 10 illustrates an example of a cross section of a pixel in an imaging device according to one embodiment of the present invention.
Figure 11:
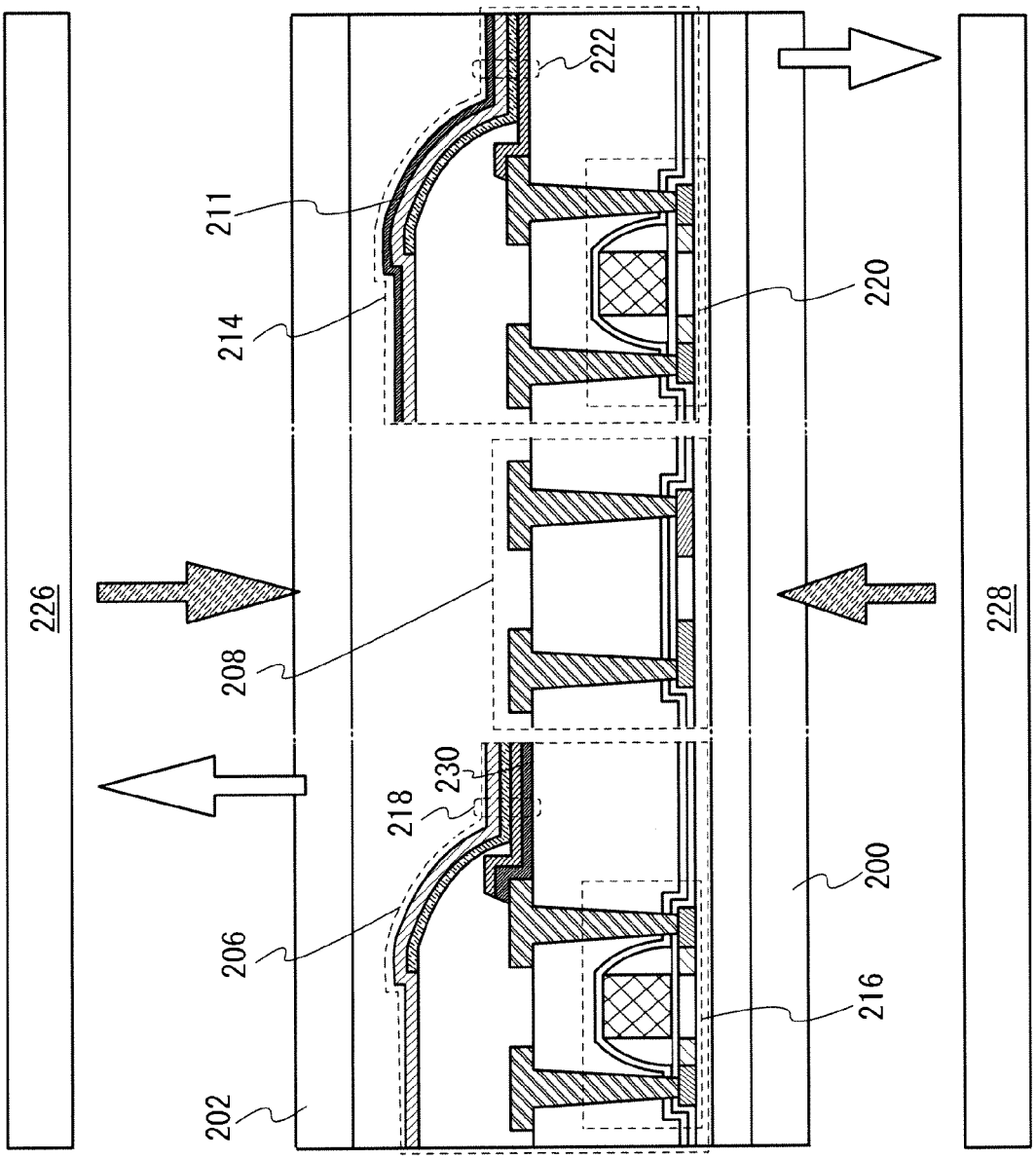
FIG. 11 illustrates an example of a cross section of a pixel in an imaging device according to one embodiment of the present invention.

Alternatively, only one of the first light-receiving element and the second light-receiving element, the one which receives light through both planes, may be provided (FIGS. 10 and 11).

The operation of the imaging devices illustrated in FIGS. 10 and 11 will be described. Light emitted from the first light-emitting element 206 is directed to the first subject 226 and partly reflected, and the reflected light is received by the first light-receiving element 208. Light emitted from the second light-emitting element 214 is directed to the second subject 228 and partly reflected, and the reflected light is also received by the first light-receiving element 208. An image of the first subject 226 is taken with the light that the first light-receiving element 208 receives while the first light-emitting element 206 emits light. An image of the second subject 228 is taken with the light that the first light-receiving element 208 receives while the second light-emitting element 214 emits light.

In the imaging devices illustrated in FIGS. 10 and 11, the first light-blocking film 204 in FIGS. 3 to 6 is not needed because the reflective electrode 230 is provided below the first light-emitting element 206. Thus, the imaging devices can be fabricated through a simpler process.

Further, the imaging devices illustrated in FIGS. 10 and 11 achieve higher density of pixels including the light-receiving elements and higher resolution of taken images than the other above-described imaging devices.

Embodiment 3

Embodiments 1 and 2 explain the cases where the first and second light-emitting elements are top-emission elements or bottom-emission elements; alternatively, the first and second light-emitting elements may be dual-emission elements. Embodiment 3 will explain a mode in which the first and second light-emitting elements have a dual-emission structure.

Figure 12:
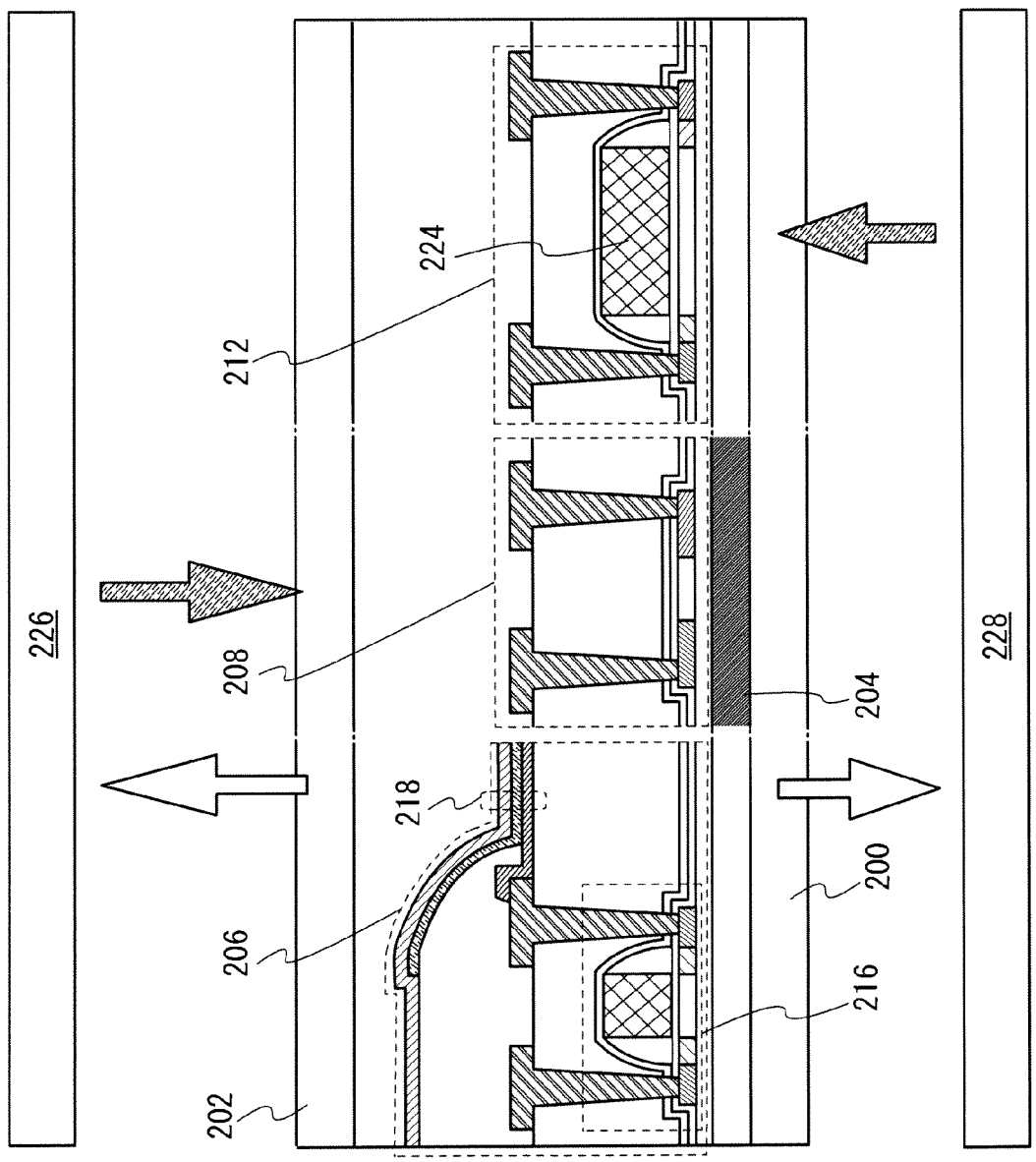
FIG. 12 illustrates an example of a cross section of a pixel in an imaging device according to one embodiment of the present invention.

FIG. 12 illustrates a mode in which the first light-emitting element 206 in FIG. 3 is a dual-emission element and the second light-emitting element 214 is not provided.

The operation of the imaging device illustrated in FIG. 12 will be described. Light emitted from the first light-emitting element 206 is directed to the first subject 226 and partly reflected, and the reflected light is received by the first light-receiving element 208; at the same time, light emitted from the first light-emitting element 206 is also directed to the second subject 228 and partly reflected, and the reflected light is received by the second light-receiving element 212. An image of the first subject 226 is taken with the light received by the first light-receiving element 208, and an image of the second subject 228 is taken with the light received by the second light-receiving element 212.

FIG. 13 illustrates a mode in which the first light-emitting element 206 in FIG. 7 is a dual-emission element and the second light-emitting element 214 is not provided.

The operation of the imaging device illustrated in FIG. 13 will be described. Light emitted from the first light-emitting element 206 is directed to the first subject 226 and partly reflected, and the reflected light is received by the first light-receiving element 208; at the same time, light emitted from the first light-emitting element 206 is also directed to the second subject 228 and partly reflected, and the reflected light is received by the first light-receiving element 208 and the second light-receiving element 212. In this case, images of the first subject 226 and the second subject 228 can be taken by using a differential circuit.

Since a light-blocking film that overlaps the light-emitting element is not provided in this embodiment, the third light-blocking film 224, which is formed using the same layer as the gate electrode of the first transistor 216, is preferably used to shield the light-receiving elements from light. Specifically, since only the third light-blocking film 224, which is formed using the same layer as the gate electrode, is provided as the light-blocking layer in FIG. 13, the mode illustrated in FIG. 13 is particularly preferable because a step of forming only a light-blocking layer is not necessary and thus the fabrication process can be simplified.

The imaging devices illustrated in FIGS. 12 and 13 achieve higher density of pixels including the light-emitting elements and higher resolution of taken images than the other above-described imaging devices.

EXPLANATION OF REFERENCE

100: imaging device, 110: book, 120: imaging region, 122: first driver circuit, 124: read circuit, 126: second driver circuit, 130: pixel, 132: first light-emitting element, 134: first light-receiving element, 136: second light-emitting element, 138: second light-receiving element, 140: first light-blocking film, 142: second light-blocking film, 200: substrate, 202: sealing substrate, 204: first light-blocking film, 206: first light-emitting element, 208: first light-receiving element, 210: second light-blocking film, 211: second light-blocking film, 212: second light-receiving element, 214: second light-emitting element, 216: first transistor, 218: first light-emitting portion, 220: second transistor, 222: second light-emitting portion, 224: third light-blocking film, 226: first subject, 228: second subject, 230: reflective electrode This application is based on Japanese Patent Applications serial No. 2011-236615 filed with Japan Patent Office on Oct. 28, 2011, the entire contents of which are hereby incorporated by reference.

The invention claimed is:

1. An imaging device comprising:
   a first substrate having an insulating film on a first surface of the first substrate;
   a second substrate having a first surface facing the first surface of the first substrate;
   a light-emitting element, a first light-receiving element, and a second light-receiving element which form on the insulating film over the first surface of the first substrate; and
   a first light-blocking film, in contact with the second-light receiving element, between the first surface of the second substrate and the second light-receiving element,
   wherein a first imaging plane is located on a second surface of the second substrate and the first light-receiving element is configured to directly receive light through the first imaging plane, and
   wherein a second imaging plane is located on a second surface of the first substrate and the second light-receiving element is configured to directly receive light through the second imaging plane.

2. The imaging device according to claim 1,
   wherein light emitted from the light-emitting element is directed to a first subject above the first imaging plane, and light reflected from the first subject is directed to the first light-receiving element, and
   wherein light emitted from the light-emitting element is directed to a second subject above the second imaging plane, and light reflected from the second subject is directed to the second light-receiving element.

3. The imaging device according to claim 1, further comprising a second light-blocking film between the first surface of the first substrate and the first light-receiving element.

4. The imaging device according to claim 1, further comprising, over the first surface of the first substrate:
   a first transistor electrically connected to the light-emitting element;
   a second transistor electrically connected to the first light-receiving element; and
   a third transistor electrically connected to the second light-receiving element.

5. The imaging device according to claim 1, further comprising a second light-blocking film between the first surface of the first substrate and the first light-receiving element,
   wherein each of the first light-blocking film and the second light-blocking film comprises chromium, chromium oxide, or black resin.

6. An imaging device comprising:
a first substrate having an insulating film on a first surface of the first substrate;
a second substrate having a first surface facing the first surface of the first substrate;
a first light-emitting element, a second light-emitting element, and a first light-receiving element which form on the insulting film over the first surface of the first substrate;
a reflective film between the first surface of the first substrate and the first light-emitting element; and
a light-blocking film, in contact with the second light-emitting element, between the first surface of the second substrate and the second light-emitting element,
wherein a first imaging plane is located on a second surface of the second substrate,
wherein a second imaging plane is located on a second surface of the first substrate, and
wherein the first light-receiving element is configured to directly receive light through the first imaging plane and light through the second imaging plane.

7. The imaging device according to claim 6,
wherein light emitted from the first light-emitting element is directed to a first subject above the first imaging plane, and light reflected from the first subject is directed to the first light-receiving element, and
wherein light emitted from the second light-emitting element is directed to a second subject above the second imaging plane, and light reflected from the second subject is directed to the first light-receiving element.

8. The imaging device according to claim 6, further comprising a second light-receiving element over the first surface of the first substrate, wherein the second light-receiving element is configured to receive light through the second imaging plane.

9. The imaging device according to claim 6, further comprising, over the first surface of the first substrate:
a first transistor electrically connected to the first light-emitting element;
a second transistor electrically connected to the second light-emitting element; and
a third transistor electrically connected to the first light-receiving element.

10. The imaging device according to claim 6, wherein the light-blocking film comprises chromium, chromium oxide, or black resin.

11. An imaging device comprising:
a first substrate having an insulating film on a first surface of the first substrate;
a second substrate having a first surface facing the first surface of the first substrate;
a first light-emitting element, a second light-emitting element, a first light-receiving element, and a second light-receiving element which form on the insulating film over the first surface of the first substrate;
a reflective film between the first surface of the first substrate and the first light-emitting element;
a first light-blocking film between the first surface of the second substrate and the second light-emitting element; and
a second light-blocking film, in contact with the second light-receiving element, between the first surface of the second substrate and the second light-receiving element,
wherein a first imaging plane is located on a second surface of the second substrate, and the first light-receiving element is configured to directly receive light through the first imaging plane, and
wherein a second imaging plane is located on a second surface of the first substrate, and the second light-receiving element is configured to directly receive light through the second imaging plane.

12. The imaging device according to claim 11,
wherein light emitted from the first light-emitting element is directed to a first subject above the first imaging plane, and light reflected from the first subject is directed to the first light-receiving element, and
wherein light emitted from the second light-emitting element is directed to a second subject above the second imaging plane, and light reflected from the second subject is directed to the first light-receiving element and the second light-receiving element.

13. The imaging device according to claim 11, further comprising, over the first surface of the first substrate:
a first transistor electrically connected to the first light-emitting element;
a second transistor electrically connected to the second light-emitting element;
a third transistor electrically connected to the first light-receiving element; and
a fourth transistor electrically connected to the second light-receiving element.

14. The imaging device according to claim 11, wherein each of the first light-blocking film and the second light-blocking film comprises chromium, chromium oxide, or black resin.

15. An imaging device comprising:
a first substrate having an insulating film on a first surface of the first substrate;
a second substrate having a first surface facing the first surface of the first substrate;
a first light-emitting element, a second light-emitting element, a first light-receiving element, and a second light-receiving element which form on the insulating film over the first surface of the first substrate;
a first light-blocking film between the first surface of the first substrate and the first light-emitting element;
a second light-blocking film between the first surface of the first substrate and the first light-receiving element;
a third light-blocking film between the first surface of the second substrate and the second light-emitting element; and
a fourth light-blocking film, in contact with the second light-receiving element, between the first surface of the second substrate and the second light-receiving element,
wherein a first imaging plane is located on a second surface of the second substrate and the first light-receiving element is configured to directly receive light through the first imaging plane, and
wherein a second imaging plane is located on a second surface of the first substrate and the second light-receiving element is configured to directly receive light through the second imaging plane.

16. The imaging device according to claim 15,
wherein light emitted from the first light-emitting element is directed to a first subject above the first imaging plane, and light reflected from the first subject is directed to the first light-receiving element, and
wherein light emitted from the second light-emitting element is directed to a second subject above the second imaging plane, and light reflected from the second subject is directed to the second light-receiving element.

17. The imaging device according to claim 15, further comprising, over the first surface of the first substrate:
- a first transistor electrically connected to the first light-emitting element; a second transistor electrically connected to the second light-emitting element;
- a third transistor electrically connected to the first light-receiving element, and a fourth transistor electrically connected to the second light-receiving element.

18. The imaging device according to claim 15, wherein each of the first light-blocking film, the second light-blocking film, the third light-blocking film, and the fourth light-blocking film comprises chromium, chromium oxide, or black resin.

* * * * *

UNITED STATES PATENT AND TRADEMARK OFFICE
CERTIFICATE OF CORRECTION

PATENT NO. : 8,847,245 B2  
APPLICATION NO. : 13/645546  
DATED : September 30, 2014  
INVENTOR(S) : Yoshiyuki Kurokawa et al.

Page 1 of 1

It is certified that error appears in the above-identified patent and that said Letters Patent is hereby corrected as shown below:

In the Specification:

Col. 7, line 10, "poly[N,N-bis(4-butylphenyl)-N,N-bis(phenyl)benzidine]" should read
--poly[N,N'-bis(4-butylphenyl)-N,N'-bis(phenyl)benzidine]--

Col. 7, lines 47, "(2P CABPhA)" should read --(2PCABPhA)--

Col. 8, lines 44-45, "polyp-phenylenevinylene)" should read
--poly($p$-phenylenevinylene)--

Col. 9, line 25, "(pyri din-3,5-diyl)]" should read --(pyridine-3,5-diyl)]--

In the Claims:

Claim 6, Col. 15, line 8 "insulting" should read --insulating--

Signed and Sealed this
Twenty-first Day of April, 2015

Michelle K. Lee
*Director of the United States Patent and Trademark Office*